United States Patent [19]

Togneri

[11] 4,340,852
[45] Jul. 20, 1982

[54] SCANNING SYSTEM USING ALTERNATING CURRENT FOR INDICATING THE OPEN, CLOSED AND GROUND CONDITION OF A CONTACT

[76] Inventor: Mauro G. Togneri, P.O. Box 12818, Houston, Tex. 77017

[21] Appl. No.: 65,370

[22] Filed: Aug. 9, 1979

[51] Int. Cl.³ .............................................. G01R 31/02
[52] U.S. Cl. .................................... 324/51; 340/644; 340/650
[58] Field of Search ........... 324/51; 340/644, 650–652

[56] References Cited

U.S. PATENT DOCUMENTS

| | | | |
|---|---|---|---|
| 2,895,106 | 7/1959 | Taunt | 324/51 X |
| 3,505,664 | 4/1970 | Morris | 340/644 |
| 3,766,435 | 10/1973 | Childers | 324/51 UX |
| 3,840,782 | 10/1974 | Monaghan | 324/51 X |
| 3,877,000 | 4/1975 | Kosco | 340/644 |
| 4,104,620 | 8/1978 | Cronin | 340/644 |
| 4,134,025 | 1/1979 | Levin | 340/644 X |

Primary Examiner—Gerard R. Strecker

[57] ABSTRACT

A simple but effective means for employing alternating polarity current in a discrete inputs can system is disclosed. The system permits scanning of a field contact for open mode, closed mode and for the presence or absence of spurious ground contacts.

8 Claims, 2 Drawing Figures

SCANNING SYSTEM USING ALTERNATING CURRENT FOR INDICATING THE OPEN, CLOSED AND GROUND CONDITION OF A CONTACT

TECHNICAL FIELD

The present invention relates to an improved discrete input scanning and isolation circuit. Opto isolators are also used in the circuit for separating logic circuits from the input circuitry. More particularly it relates to an alternating current digital scanning system with self-checking input circuitry and ground detectors.

BACKGROUND ART

It has been well known to use sensing devices which have discrete state outputs in response to the state of the variable sensed by such device.

The discrete state outputs are normally introduced into a relay, solid state or computer circuit through a D.C. circuit.

DISCLOSURE OF INVENTION

The present invention uses a simple but effective means for employing alternating polarity current in a discrete input scan system. It permits scanning, for example, a field contact for open mode, closed mode and, in addition, for the presence or absence of spurious ground contacts.

BRIEF DESCRIPTION OF DRAWINGS

For a further understanding of the nature and objects of the present invention, reference should be had to the following detailed description, taken in conjunction with the accompanying drawings, in which like parts are given like reference numerals and wherein.

BEST MODE FOR CARRYING OUT THE INVENTION

Figure 1:
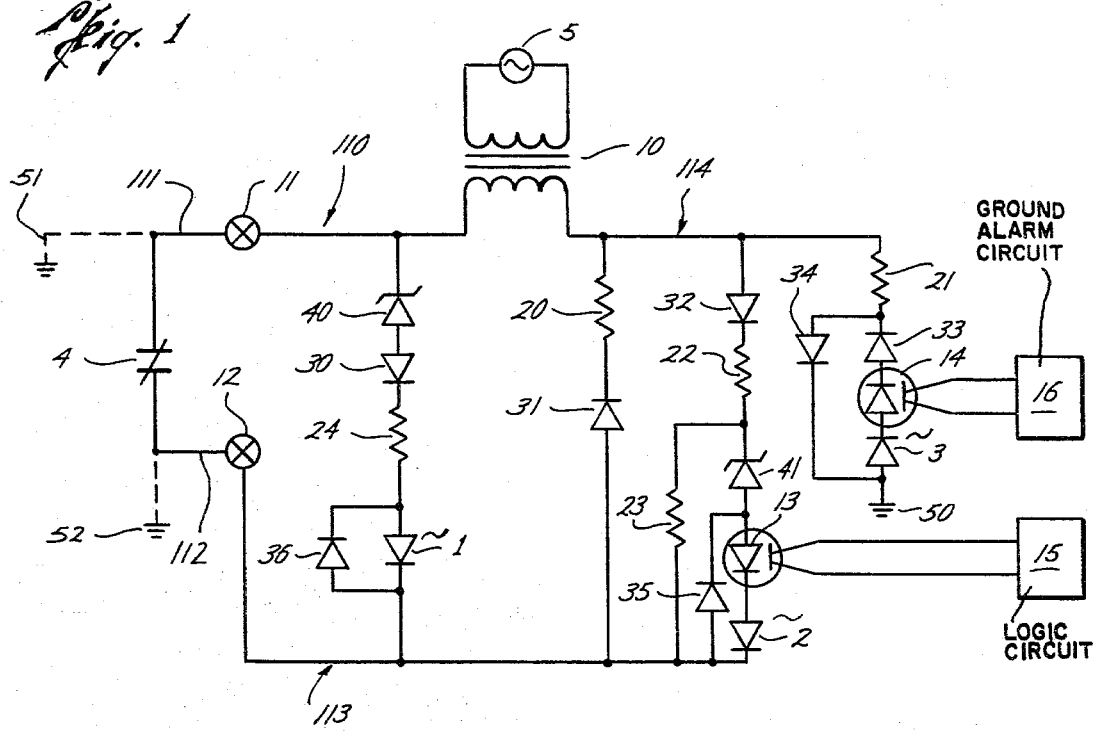
FIG. 1 is a schematic diagram of the electric schematic of the preferred embodiment of the apparatus of the present invention.

The input circuit of the preferred embodiment of the present invention shown in FIG. 1 includes a transformer 10 which supplies 60 Hertz, sine wave alternating current to the input circuit. The input size of transformer 10 is connected to an alternating current power source 5. The secondary coil of transformer 10 terminates in input circuit line 110 on the field terminal site and input circuit line 114 on the side opposite thereto. Input circuit lines 110 and 114 are electrically connected to return line 113 by three separate discriminator circuits and a field line, all to be described in more detail below.

Through input circuit line 110, the secondary coil of transformer 10 is electrically connected to one of the field terminals, e.g., field terminal 11. Field terminal 11 is connected to field terminal 12 through field lines 111 and 112 and field contact 4 between lines 111, 112. Field contact 4 is capable of an open or closed mode. Return line 113, terminating in field terminal 12, is also connected to input circuit line 110 by a circuit electrically connected in parallel to field terminal 12. The parallel circuit includes an electrically conducting wire from line 113 to the cathode of light emitting diode 1 and to the anode of diode 36. Both the anode of light emitting diode 1 and the cathode of diode 36 are electrically connected to one end of resistor 24. The other end of resistor 24 is connected to the cathode of diode 30, the anode of which is in turn connected to the anode of Zener diode 40. The cathode of Zener diode 40 is electrically connected to input circuit line 110.

Return line 113 is further connected to input circuit line 114 through second and third parallel connected discriminator circuits. The second circuit includes a resistor 20 wired between input circuit line 114 and the cathode of diode 31. The anode of diode 31 is connected to return line 113. The third circuit includes one main branch and two sub branches. The main branch has a diode 32, the anode of which is electrically connected to input circuit line 114 and the cathode of which is connected to resistor 22. From resistor 22 electrical connection is established through the first branch point with the cathode of Zener diode 41. The anode of Zener diode 41 is connected through the second branch point to the anode of opto isolator 13. The cathode of opto isolator 13 is connected to the anode of light emitting diode 2, the cathode of which is wired into return line 113. The anode of by-pass diode 35 is also electrically connected to the second branch point. The cathode of by-pass diode 35 is electrically connected between the anode of Zener diode 41 and the anode of opto isolator 13. Resistor 23 is electrically connected between the first branch point and return line 113. The photo sensor of opto isolator 13 is electrically connected to the input of a logic circuit, generally indicated by reference numeral 15. Logic circuit 15 may be of any configuration known in the art, such as an alarm light or shutdown or indicator light or logic interlock, capable of being driven by a photo sensor of opto isolator 13 dependant on the response required from detection of an open or closed contact 4.

Input circuit line 114 is also connected to ground through a control circuit comprising resistor 21 electrically connected to the cathode of diode 33, the anode of which is connected to the cathode of opto isolator 14. The anode of opto isolator 14 is electrically connected to the cathode of light emitting diode 3, the anode of which is wired to ground 50. Ground 50 is also connected to the cathode by by-pass diode 34, the anode of which is electrically connected to the connection between resistor 21 and the cathode of diode 33. The photo sensor of opto isolator 14 is connected to a ground alarm circuit, generally indicated by reference numeral 16, which may be reasonably located. Ground alarm circuit 16 may be of any alarm configuration known in the art, such as alarm light or shutdown, capable of being driven by a photo sensor of opto isolator 14 dependent on the alarm response required from detection of a ground fault 51, 52.

Figure 2:
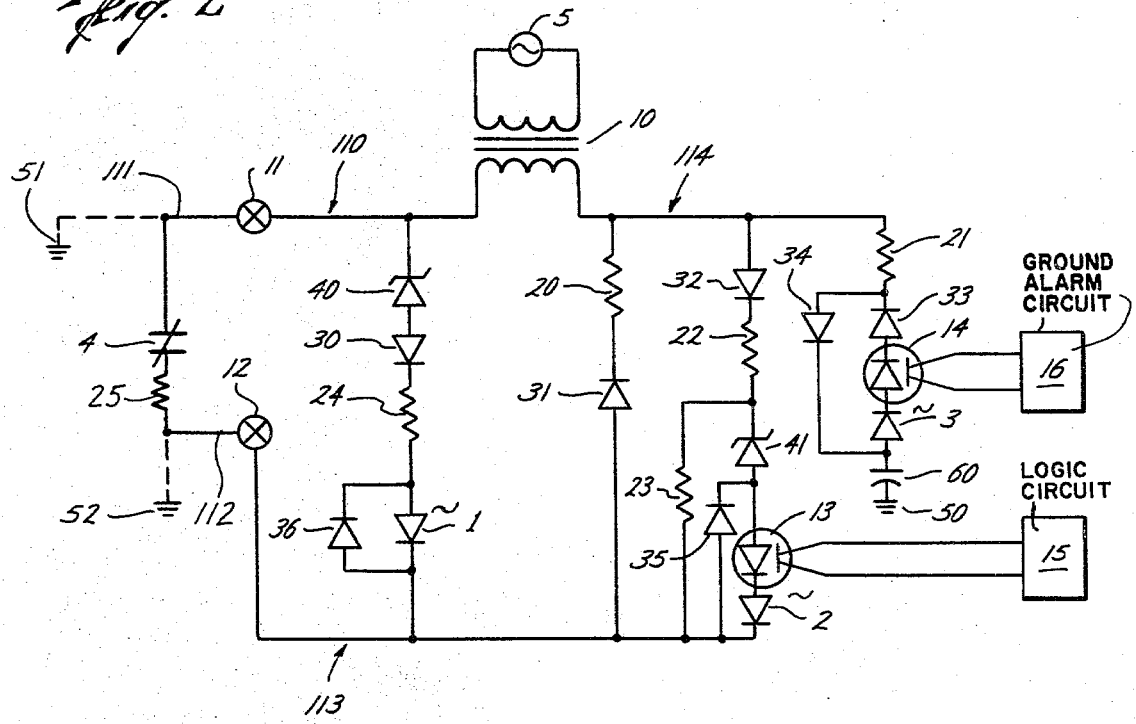
FIG. 2 is a second electric schematic of the preferred embodiment of the apparatus of the present invention also illustrating additional means for direct current isolation of the circuit shown in FIG. 1 as well as another modification which permits localizing spurious grounds within the field contact loop.

Referring now to FIG. 2, a different embodiment of the present invention is shown. The modifications of the circuit of FIG. 2 include the addition of a capacitor 60 connected between ground 50 and the anode of light emitting diode 3 and the cathode of by-pass diode 34. It further includes resistor 25 between contact 4 and terminal 12.

In operation, during one half-cycle, henceforth referred to as the first half-cycle, current will flow from transformer 10 through terminal 11, field contact 4 (presuming it to be closed), terminal 12, diode 31 and resistor 20. Current flow through Zener diode 40 is blocked since the voltage required to cause it to conduct is higher than the voltage drop across terminals 11 and 12, as long as field contact 4 is closed. Under these conditions, and in the absence of any spurious ground contacts, neither light emitting diode 1, nor light emitting diodes 2 and 3 will light up.

During the opposite half-cycle, henceforth referred to as the second half-cycle, the current flow is reversed. Diode 31 will now block the flow of current through the loop described above. Assuming once more that field contact 4 remains closed and that no other ground contacts besides reference ground 50 are present in the circuit, current flow will now pass through diode 32, resistors 22 and 23, Zener diode 41, opto isolator 13 and from light emitting diode 2 back through terminal 12, field contact 4 and terminal 11 to transformer 10. In that case, current flowing through optical isolator 13 activates the output to logic, generally indicated by reference numeral 15, thus forwarding the closed field contact 4 information in the form of an approximate 50% duty cycle square wave. The square wave is generated by the half wave rectified current in the input diode of opto isolator 13. Since the interval between flow reversals is only 1/60th of a second, light emitting diode 2 will, for all practical purposes, appear to be continuously lighted so long as field contact 4 remains closed. Hence light emitting diode 2 may be viewed as the "closed contact" indicator of the input scanning system of the present invention.

Reverting now to the first half-cycle current flow, once field contact 4 opens, the voltage across Zener diode 40 will increase until current flows through Zener diode 40, diode 30, resistor 24, light emitting diode 1 and back again through diode 31 and resistor 20 to transformer 10. During the second half-cycle, all return paths will be either blocked or interrupted by diode 30 and the open field contact 4. Assuming again that no ground contacts besides reference ground 50 exist anywhere in the circuit, light emitting diode 1 will appear to be continuously lighted so long as field contact 4 stays open. Hence, light emission diode 1 may be said to be the "open contact", indicator of the input scanning system of the present invention.

In addition to the indicating features just described and the fact that alternating polarity current can be directly utilized to gate into the logic circuit of the main system (not shown), the input circuit of the present invention is capable of scanning the field terminal's loop for spurious ground circuits. For that purpose, a ground alarm circuit, generally indicated by reference numeral 16, triggered by opto isolator 14, may be employed to provide distant ground contact information and another light emitting diode 3 will permit local ground detection in conjunction with gate state indicators 1 and 2.

Ground contacts within the field loop may occur either on the output side 111 of transformer 10, e.g., between terminal 11 and field contact 4, or on the input side 112 of the input circuit, e.g., between field contact 4 and terminal 12. The first type of ground contact is schematically indicated in FIG. 1 by reference numeral 51, the latter type by reference numeral 52. Naturally, ground contacts may also occur simultaneously on both sides of field contact 4. In other words, four cases must be uniquely distinguished by the scanning system of the present invention for both open and closed field contact states: (i) no ground contacts within the field loop; (ii) a ground contact 51 but not 52; (iii) a ground contact 52 but not 51; and (iv) both ground 51 and 52.

If only ground contact 51 is present within the field loop and field gate 4 is closed, then current will flow during the first half-cycle from transformer 10 through field terminal 11 to ground 51 and from reference ground 50 through light emitting diode 3, opto isolator 14, diode 33 and resistor 21 back to transformer 10. Some residual current will, of course, continue to flow through contact 4, terminal 12, diode 31 and resistor 20 back to transformer 10. Thus, during the first half-cycle, with contact 4 closed and only field ground contact 51 present, only light emitting diode 3 will light up. During the second half-cycle under these same conditions, current will flow from transformer 10 through resistor 21 and by-pass diode 34 to reference ground 50 and back up from field ground contact 51 through terminal 11 to transformer 10. Some current will also continue to flow through the diode 32 path, however, and hence through the logic output opto isolator 13 and light emitting diode 2. Electrically, the output to logic will be the same in form, if the flow is sufficient to activate opto isolator 13 as in the previous situation where ground 51 was not present. In addition, there will be a similar 50% duty cycle square wave generated by the half wave recitified current in the input diode of alarm opto isolator 14. Visually, the 60 cycle intervals will again be indistinguishable by the naked eye and the local indicator board of the present scanner system will, therefore, consist of a slighly dimmer light emitting diode 2 coupled with a lighted light emitting diode 3 to signify closed field contact 4 and the presence of a field ground contact 51.

If field contact 4 is in an open position then on the first half-cycle some current will continue to flow as previously indicated, i.e., through Zener diode 40 and, hence, through light emitting diode 1 (returning to transformer 10 via diode 31 and resistor 20). Current will also pass through the grounded section of 111 to ground 51, however, and back from ground 50 through light emitting diode 3 and ground alarm opto isolator 14. In the second half-cycle no current will pass under these conditions through the main input circuit loops but only through bypass diode 34 and between grounds 50 and 51. Nevertheless, the visual appearance of the indicator board will be that of a more or less continuously lighted light emitting alarm diode 3 coupled with a now somewhat dimmer light emitting diode 1 to indicate open field contact 4 and ground contact 51.

A spurious ground contact may also appear on the input side of field terminal 12, as generally indicated by reference numeral 52 in FIG. 1. In that case, the current flow will be exactly the same as described above under the presence of ground contact 51, regardless of whether field contact 4 is open or closed. Hence, this particular embodiment does not yet permit discrimination between ground locations 51 and 52.

It might also happen that both ground contact 51 and 52 are present at the same time. In that case field contact 4 is essentially shortened out altogether and, regardless of it being open or closed, light emitting diode 1 will be off while light emitting diodes 2 and 3 will be on at all times in this particular embodiment's circuit configuration.

Referring now to FIG. 2, a slight modification of the above described embodiment is shown which renders possible the additional discrimination modes for ground contact localization. Resistor 25 is placed in series with field contact 4. The additional voltage drop across 25 will dim light emission diode 2 so long as field contact 4 is closed. By contrast this will make light emitting diode 1 appear relatively brighter so long as field contact 4 is the open mode.

Yet another slight modification of the basic circuit of the present invention is illustrated in the ground alarm system. A capacitor 60 is placed between light emitting diode 3 and reference ground 50. This feature will ensure additional isolation of the input circuit of the present invention from any direct current buildup.

INDUSTRIAL APPLICABILITY

The advantages of opto isolated input systems are well known in the art. The present invention, however, overcomes the major limitation of prior opto isolation input boards by using alternative current circuitry in lieu of the customary direct current converters and choppers. In addition, the present invention may be operated as a pulse detector so long as the frequency of field pulse source 4 is lower than the alternating current's basic half-cycle frequency. Furthermore, the present invention has applications whenever alternating current ground paths need to be detected and located.

Because many varying and different embodiments may be made within the scope of the inventive concept herein taught, and because many modifications may be made in the embodiment herein detailed in accordance with the descriptive requirements of the law, it is to be understood that the details herein are to be interpreted as illustrative and not in a limiting sense.

What is claimed as invention is:

1. An alternating-current input and scanning system, with an alternative polarity power source, for scanning an open or closed field loop wherein such field loop may be subject to a ground contact, comprising:

first input processing means responsive to one-half cycle of such power source for detecting such closure of such field loop, said first input processing means being electrically connected to such field loop and such power source;

second input processing means responsive to the other one-half cycle of such power source for detecting such opening of such loop, said second input processing means being electrically connected to such field loop and such power source; and ground control processing means responsive to such power source and such ground contact for producing an alternating polarity ground signal indicating the status of such ground contact within such field loop.

2. The system of claim 1 wherein said ground control processing means includes ground alarm indicator means for indicating the presence or absence of ground contacts within such field loop.

3. The system of claim 1 wherein said ground control processing means include means for isolating said input system.

4. The system of claim 1 wherein said first input processing means include means for isolating said alternating polarity power source from said scanning system.

5. The system of claim 1 wherein said first and second input processing means include cooperative means for producing an alternate polarity signal for at least one state of such field loop.

6. An alternating current input and scanning system, with an alternating polarity power source, for scanning an open or closed field loop wherein such field loop may be subject to a ground contact, comprising:

first input processing means response to one-half cycle of such power source for detecting such closure of such field loop said first input processing means being electrically connected to such field loop and such power source;

second input processing means responsive to the other one-half cycle of such power source for detecting such opening of such loop, said second input processing means being electrically connected to such field loop and such power source; and ground control processing means responsive to such power source and such ground contact for producing a ground signal indicating the status of such ground contact within such field loop;

wherein said first input processing means further include first inhibiting means for preventing said second input processing means from being bypassed during one of the alternating polarity half cycles in the closed mode of such field loop.

7. The system of claim 6 wherein said first input processing means further include second inhibiting means for preventing said second input processing means from being triggered during one of the alternating polarity half cycles in the open mode of such field loop.

8. The system of claim 7 wherein said second input processing means include means for isolating said input system.

* * * * *

UNITED STATES PATENT AND TRADEMARK OFFICE
CERTIFICATE OF CORRECTION

PATENT NO. : 4,340,852
DATED : July 20, 1982
INVENTOR(S) : Mauro G. Togneri

It is certified that error appears in the above-identified patent and that said Letters Patent is hereby corrected as shown below:

ON THE TITLE PAGE INSERT,

-- [73] Assignee: Powell Industries, Inc.
Houston, Tex. --.

Signed and Sealed this

First Day of March 1983

[SEAL]

Attest:

GERALD J. MOSSINGHOFF

Attesting Officer

Commissioner of Patents and Trademarks